US006321428B1

(12) United States Patent
Toda et al.

(10) Patent No.: US 6,321,428 B1
(45) Date of Patent: Nov. 27, 2001

(54) METHOD OF MAKING A PIEZOELECTRIC TRANSDUCER HAVING PROTUBERANCES FOR TRANSMITTING ACOUSTIC ENERGY

(75) Inventors: Minoru Toda, Lawrenceville, NJ (US); Kyung-Tae Park, Berwyn; Jeffrey D. Swan, West Chester, both of PA (US)

(73) Assignee: Measurement Specialties, Inc., Fairfield, NJ (US)

( * ) Notice: Subject to any disclaimer, the term of this patent is extended or adjusted under 35 U.S.C. 154(b) by 0 days.

(21) Appl. No.: 09/537,199

(22) Filed: Mar. 28, 2000

(51) Int. Cl.[7] .................................................. H01L 41/00
(52) U.S. Cl. ...................... 29/25.35; 310/328; 310/800; 381/114; 381/190
(58) Field of Search .......................... 29/25.35; 310/324, 310/328, 800; 381/114, 173, 190

(56) References Cited

U.S. PATENT DOCUMENTS 6,011,855 * 1/2000 Selfridge et al. ................ 310/328 X

* cited by examiner

Primary Examiner—Carl E. Hall
(74) Attorney, Agent, or Firm—Duane Morris LLP

(57) ABSTRACT

A method of forming an ultrasound transducer having thermoformed protuberances comprises providing a substrate having a plurality of perforations of a given dimension. The perforations or apertures are formed in the substrate and operate to determine the resonance frequency associated with the transducer. A film of polymeric material capable of showing piezoelectric properties when strained in its plane and electrically biassed by a field applied in a direction normal to its faces, is then laminated onto the substrate. The film is heated to a given temperature and a pressure differential is applied between the top and bottom surfaces of the film for a sufficient time to form protuberances in the film through the apertures in the substrate. The film is then cooled to a given ambient temperature while maintaining a pressure differential between the top and bottom surfaces of the film for a sufficient time until the ambient temperature is reached so as to cause the protuberances to maintain a substantially permanent curvature.

23 Claims, 16 Drawing Sheets

METHOD OF MAKING A PIEZOELECTRIC TRANSDUCER HAVING PROTUBERANCES FOR TRANSMITTING ACOUSTIC ENERGY

FIELD OF THE INVENTION

The present invention relates to devices using as a transducer element a film of piezoelectric polymer provided with electrodes on its surfaces, and more particularly to a piezoelectric transducer having protuberances for effective excitation of acoustic energy by resonance effect and a method of making such a transducer.

BACKGROUND OF THE INVENTION

Piezoelectric film has many advantages in the applications of transducers, sensors and electroacoustic devices. Piezoelectric polymeric materials include PVDF or $PVF_2$ polyvinylidene fluoride), and its copolymer PVDF-TrFE (polyvinylidene fluoride—trifluoroethylene). When PVDF film is curved along the unidirectionally stretched direction and driven by an electrical field such as an AC field, displacement in the length direction is converted into the direction normal to the surface, and acoustic radiation results. This operates to generate an acoustic wave in the air. Using this design, piezoelectric material such as PVDF film can be used to make a loudspeaker or a microphone when the frequency of the generated acoustic wave is below 20 kHz. When the frequency is above 20 kHz, an ultrasound transducer may be formed.

A flat transducer of PVDF film material can also be made. U.S. Pat. No. 6,011,855, issued Jan. 4, 2000 to Selfridge et al., for example, discloses a speaker device for emitting subsonic, sonic or ultrasonic compression waves. The device includes a hollow drum, a rigid emitter plate attached to the drum, and a plurality of apertures formed within the plate which are covered by a thin flat layer of piezoelectric film disposed across the emitter plate. By using a negative or positive biasing pressure, a back cavity to create tension in the PVDF film, the device vibrates in substantially uniform fashion. However, such a structure and method has significant limitations, including requiring constant application of pressure differential in order to deform the PVDF material and to operate the transducer.

The beam angle of an ultrasonic transducer is controlled by the dimensions of the active area and the drive frequency of the transducer. The resonance frequency of a curved PVDF film (such as PVDF film curved into a partial cylinder, cylinder or sphere) depends on the curvature as well as the material properties of the PVDF film. For the same film, the frequency is higher when the radius of the curvature is small, and lower when the radius is larger. For a loudspeaker resonant at 1 kHz, the radius is about 20 cm. For an ultrasound transducer of 40 kHz, the radius is about 4–5 mm. Thus, it is important to design and control the curvature radius.

Curved PVDF may be used for a variety of applications, such as audio speakers and microphones and for ultrasound transducers with frequencies up to 180 kHz. For the application of omnidirectional ultrasound transducers, the resonance frequency of conventional transducers is limited by the radius/diameter of the film cylinder. For example, as depicted in FIG. 4D, transducer 90 having a frequency $f_1$ of 40 kHz has a cylinder diameter D1 of about 1 cm. With a height H1 of about 1 cm, the active radiating area is about 3 $cm^2$. As illustrated in FIG. 4E, for a transducer 90' with a frequency $f_2$ of 100 kHz or higher, the diameter D2 of the cylinder would be significantly smaller than D1 (approximately 0.4 cm) and the radiating area would be smaller than 1.2 $cm^2$. However, it is extremely difficult to fabricate such small PVDF film cylinders and ultrasound pressures resulting from their operation are similarly diminished due to the small radiating area.

Moreover, for a partial cylinder or sphere, the PVDF film needs to be supported by an annular/linear supporter in order to obtain the curved shape. In order to efficiently transmit an acoustic wave into the air, the edges of the film need to be rigidly clamped. Such ultrasonic transducers and methods of manufacture are illustrated in commonly assigned co-pending U.S. patent application Ser. No. 09/281,247 filed on Mar. 30, 1999 entitled "Omni-directional Ultrasonic Transducer Apparatus and Staking Method" and Ser. No. 09/281,398 filed on Mar. 30, 1999 entitled "Omnidirectional Ultrasonic Transducer Apparatus Having Controlled Frequency Response", the contents of which are incorporated herein by reference. The requirement of the support to the film and clamping of the edges adds more complexity to the design and manufacturing cost of these types of transducers. For ultrasound transducers, this problem becomes more severe due to the small radius of the curvature and small dimension of the transducer.

A transducer which overcomes the above problems, including frequency limiting on the whole cylinder design and mechanical clamping in the partial cylinder designs, as well as a method of making such a curved PVDF film airborne transducer which has a resonance frequency which is not influenced by thickness, cylinder diameter, or shape is highly desired.

SUMMARY OF THE INVENTION

A method of forming a transducer having thermoformed protuberances comprises providing a substrate having a plurality of perforations of a given dimension. The perforations or apertures are formed in the substrate and operate to determine the resonance frequency associated with the transducer. A film of polymeric material capable of showing piezoelectric properties is then laminated onto the substrate. The film is heated to a given temperature and a pressure differential is applied between the top and bottom surfaces of the film for a sufficient time to form protuberances in the film through the apertures in the substrate. The film is then cooled to a given ambient temperature while maintaining a pressure differential between the top and bottom surfaces of the film for a sufficient time until the ambient temperature is reached so as to cause the protuberances to maintain a substantially permanent curvature.

An alternative method is to apply pressure by rubber type pliable material instead of air pressure for forming an ultrasound transducer having protuberances comprises providing a substrate having a plurality of perforations of a given dimension. The perforations or apertures are formed in the substrate and operate to determine the resonance frequency associated with the transducer. A film of polymeric material capable of showing piezoelectric properties is then laminated onto the top of the substrate. A top plate layer is disposed at a top surface of the film and a bottom plate layer at a bottom surface of the substrate. A layer of pliable material is disposed between the top plate layer and the top surface of the film. The top and bottom plate layers are then compressed toward each other, via a press for example, to cause the layer of pliable material to forcibly engage the film to cause deformation of portions of the film through the perforations in the substrate, defining the protuberances.

A transducer apparatus such as an ultrasonic transducer comprises a substrate having an array of apertures respectively formed therein at predetermined positions on the substrate such that the array forms a given area within the substrate; a layer of polymeric piezoelectric material is disposed on the substrate, the layer of piezoelectric material has a plurality of protuberances each being defined by a respective portion of the piezoelectric material extending into a corresponding one the apertures, the plurality of protuberances being permanently formed and defining an active area of the transducer corresponding to the given area of the substrate; wherein a resonance frequency of the transducer is a function of a shape of the protuberances as determined by at least one dimension of the apertures, and wherein a vertical and horizontal beam angle associated with the transducer is controllable as a function of the active area of the transducer.

A flat ultrasonic transducer comprises a flat substrate having a plurality of apertures formed therein; a layer of polymeric piezoelectric material disposed on the flat substrate, the layer of piezoelectric material including a plurality of protuberances defined by portions of the piezoelectric material extending into corresponding ones of the apertures, the plurality of protuberances defining an active area of the transducer; wherein the resonance frequency of the transducer is a function of a curvature of each of the protuberances as determined by at least one dimension of the apertures, and wherein the output power, beam angle and frequency output is controllable as a function of the ratio of the active area to the total substrate area.

A curved ultrasonic transducer comprises a curved substrate having a plurality of apertures formed therein; a layer of polymeric piezoelectric material disposed along the curved substrate, the layer of piezoelectric material including a plurality of protuberances of a given curvature, the protuberances each being defined by portions of the piezoelectric material extending into a corresponding one of the apertures, the plurality of protuberances defining an active area of the transducer; wherein the resonance frequency of the transducer is independent of the radius of curvature of the curved substrate.

The present invention is also embodied in a speaker device comprising an ultrasonic transducer having a cylindrical substrate of a given diameter including a plurality of apertures formed therein; a layer of polymeric piezoelectric material disposed along the cylindrical substrate, the layer of piezoelectric material having a plurality of protuberances each of a given curvature, each of the protuberances defined by portions of the piezoelectric material extending into corresponding one of the apertures, the plurality of protuberances defining an active area of the transducer; wherein a resonance frequency of the transducer is independent of the diameter of the cylindrical substrate.

A housing assembly for a transducer such as an ultrasonic transducer comprises a substrate including top and bottom surfaces, the substrate formed of a conductive material and including a plurality of apertures formed therethrough; a laminate comprising a film of polymer piezoelectric material sandwiched between a first electrode layer on a top surface and a second electrode layer on a bottom surface, the laminate disposed on the top surface of the substrate, the laminate including a plurality of protuberances each of a given curvature and extending into a corresponding one of the apertures; the housing assembly comprising: a first contact in electrical communication with the first electrode, the first contact having a first arm member; a second contact in electrical communication with the substrate and having a second arm member; an end cap member having a first slot for receiving the first arm member to provide a first terminal, and a second slot for receiving the second arm member to provide a second terminal, the first and second terminal operable to provide external connectivity thereto; a front member disposed opposite the end cap member; wherein the front member is secured to the end cap member for retaining the transducer within the housing.

BRIEF DESCRIPTION OF THE DRAWINGS

The advantages, nature, and various additional features of the invention will appear more fully upon consideration of the illustrative embodiments now to be described in detail in connection with accompanying drawings wherein.

It should be understood that the drawings are for purposes of illustrating the concepts of the invention and are not necessarily to scale.

DETAILED DESCRIPTION OF THE INVENTION

A novel method of forming a transducer such as an ultrasound transducer as disclosed herein is accomplished by providing a substrate having a plurality of perforations or apertures of a given dimension formed therein; forming a laminate comprising a film of piezoelectric material sandwiched between a first electrode layer on a top surface and a second electrode layer on a bottom surface; securing the laminate to the substrate to form a composite transducer assembly; and treating the composite assembly by heating the film and applying a pressure differential between the top and bottom surfaces of the film sufficient to cause protuberances in the film at the locations of the perforations. This pressure difference may be achieved by exposing the film top surface to the air and maintaining a vacuum pressure on the substrate side. Due to this pressure difference, the film is curved toward the substrate. In a preferred embodiment, in concert with the application of a pressure differential to the film surfaces, the film and the substrate are put into a temperature oven. An elevated temperature and the pressure difference make the deformation of the PVDF film substantially permanent. In this manner, a constant bias pressure or near vacuum need not be applied to maintain the shape of the protuberances.

The resulting transducer assembly comprising the dome-shaped protuberance(s) may be electrically excited in a conventional manner via the electrodes to cause the protuberances to expand and contract so as to radiate sound waves at a predetermined frequency.

Figure 1:
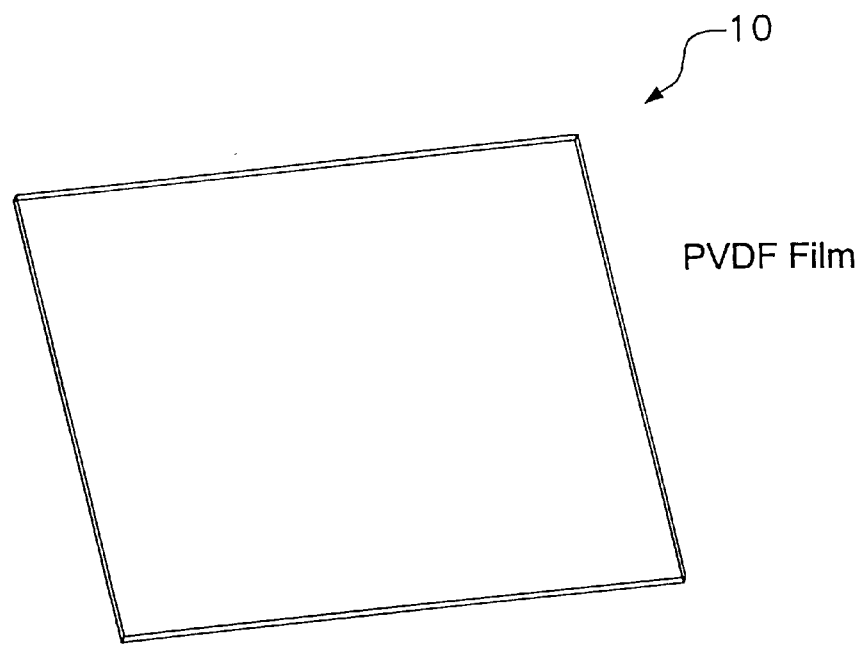
FIG. 1 is a plan view of a PVDF polymer material used in accordance with the present invention.
Figure 2:
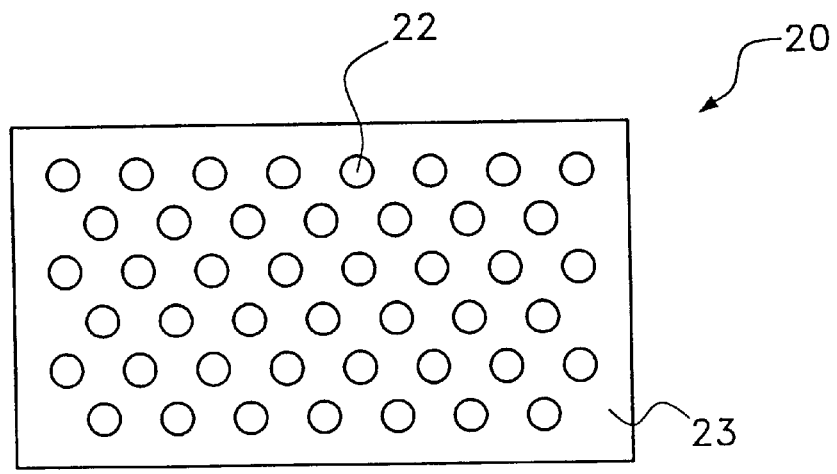
FIG. 2 is a plan view of a substrate having perforations or apertures formed therein according to an aspect of the present invention.
Figure 3A:
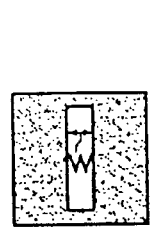
FIG. 3A–3B represent schematic views of a broad angle flat transducer having a substrate with rectangular perforations according to an aspect of the present invention.
Figure 3B:
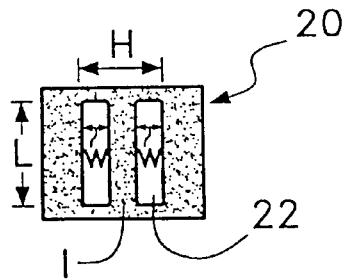
Figure 3C:
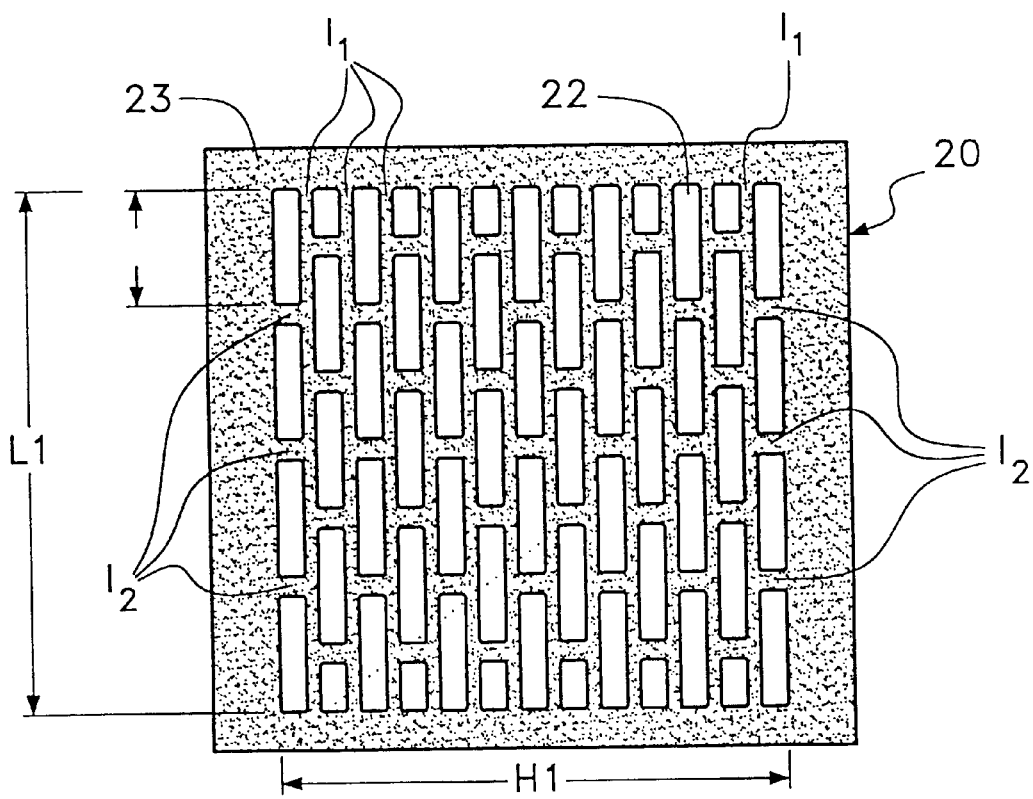
FIG. 3C represents a schematic view of a narrow beam angle flat transducer having a substrate with rectangular perforations according to an aspect of the present invention.

Referring now to FIGS. 1–6 (with emphasis on FIG. 5) wherein like reference numerals indicate like parts, a processing method for forming a piezoelectric transducer having protuberances is provided. A piezoelectric film 10 such as PVDF applied in a unidirectional stretched fashion and having electrode layers 10a and 10b on both its top and bottom surfaces, is laminated onto a perforated substrate 20. The electrode layer material may be, in a preferred embodiment, either a screen printed silver ink or sputtered thin layer of metal. The piezoelectric film should be clean on its surfaces and free of any creases, wrinkles, or pin holes. Perforated substrate 20 comprises a plurality of perforations or apertures 22 formed therein which extend entirely through to the top and bottom surfaces of the substrate. That is, the substrate is embodied as a perforated plate or cylinder having a designed pattern which is periodic, as depicted in FIGS. 2–4. Preferably, the apertures are substantially uniform in all respects, including size and shape. The material of the substrate can be metal, such as aluminum or brass, or plastic such as ABS. It can also be a printed-circuit-board plate for example. The perforated substrate represents an important part of the transducer, as the size of the apertures 22 operate to determine the curvature radius of the protuberances which determines a resonant frequency associated with the transducer. The shape and dimensions of the substrate determines the ultrasound beam pattern and the overall active aperture or hole area operates to determine the transmitted sound pressure. The substrate 20 should have a smooth top surface 23 (FIG. 3C) for lamination with the PVDF film. The substrate may be in the form of a substantially planar or flat plate as depicted in FIGS. 2, 3A, 3B, 3C or alternatively, a cylindrical shape as shown in FIGS. 4A, 4B, 4C, depending upon the application requirement. Other shapes are contemplated as well, including spherical and semi-cylindrical for example. Depending on the application, the shape of the apertures 22 of the substrate 20 may be rectangular, circular, hexagonal, rhomboid, other suitable geometric shape or combinations of these shapes.

Figure 5:
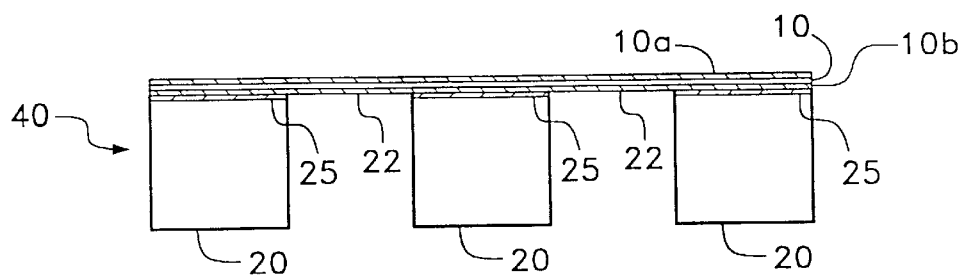
FIG. 5 represents a cross-sectional view of a transducer assembly prior to forming protuberances according to an aspect of the present invention.

Referring to FIG. 5, a layer of PVDF material 10 is laminated onto the substrate 20 using an adhesive material 25 such as epoxy to form transducer assembly 40. In the preferred embodiment, the epoxy has a pot life (time to cure) of at least one hour and may be cured at an elevated temperature which does not exceed 85 degrees C. Preferably, the layer 25 of epoxy is applied to the top surface of the substrate 20. The film 10 is then disposed on the substrate 20 with the stretched direction of the film well oriented. The film 10 should be in contact engagement with the substrate 20 along the entire top surface of the substrate except for the apertures or gaps 22. Air bubbles and gaps between the film and substrate should be removed by pressing the film from the top.

Figure 6:
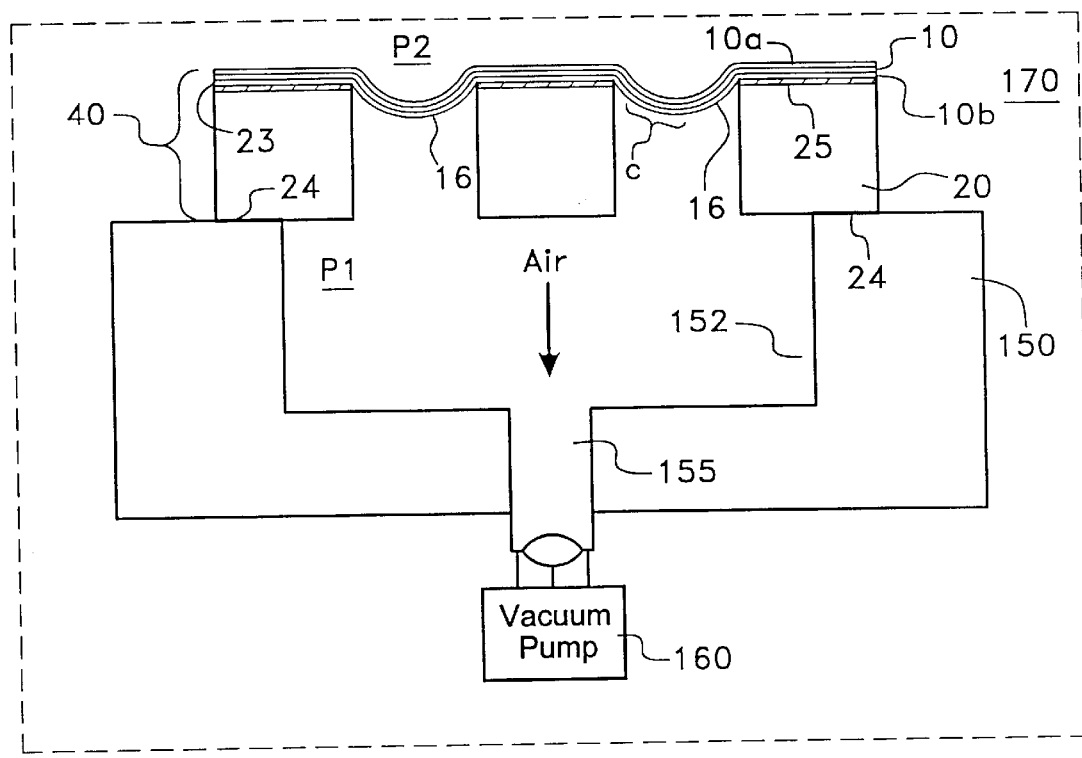
FIG. 6 illustrates the formation of the protuberances within the transducer assembly according to an aspect of the present invention.

Referring now to FIG. 6, the laminated transducer assembly 40 is then secured to a housing 150 of a vacuum pump device 160 which communicates via pipe 155. The vacuum pump includes an inner vacuum chamber area 152 in which is generated a vacuum or near vacuum to enable a pressure differential (P2−P1) between the top and bottom surfaces of the PVDF film. As shown in FIG. 6, the assembly 40 is disposed on the top surface of the vacuum housing 150 with the top surface electrode 10A of the film facing out. The edge portions 24 where the substrate engages the top surface of the vacuum housing 150 should be well sealed in order to achieve a good vacuum within the chamber 152. In the preferred embodiment, the structure 40 is secured to the vacuum housing 150 so that there are no air gaps or leaks from the chamber 152 using an adhesive or sealing means such as tape. Other suitable sealing means are also contemplated including a rubber gasket for example.

As can be seen in FIG. 6, a vacuum or near vacuum is formed on the bottom or back surface of the substrate 20. This results in a pressure difference P2−P1 between the top and bottom surfaces of the film. The vacuum housing 150 and transducer assembly 40 are then placed into a temperature oven or heat chamber 170 and heat is applied to the transducer assembly 40 in order to soften the material forming the film 10. In a particular embodiment, the heating device applies heat to the transducer assembly to raise the temperature to between 60 and 85 degrees C. and the vacuum pump 160 is activated to cause the pressure differential P2−P1 between the top and bottom surfaces of the film 10. This results in the formation of domes or protuberances 16 in film 10 at the locations of the perforations 22 in substrate 20. In the preferred embodiment, the pressure differential is approximately 13 psi and the temperature and pressure is applied for between 1 and 4 hours depending on the desired radius of curvature of the protuberances 16 of the film material. The exact conditions of temperature, vacuum pressure and time depend on the different application requirements and curvature radius desired and are contemplated to be well within the skill level of the skilled artisan.

Figure 14:
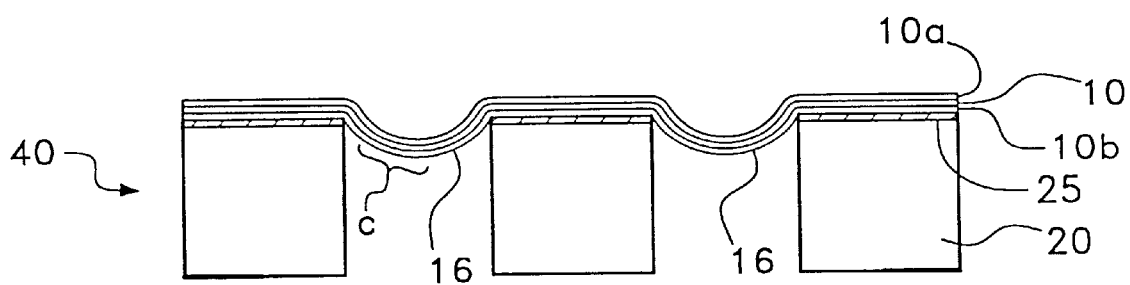
FIG. 14 represents a cross-sectional view of the transducer assembly having protuberances formed through perforations in the substrate in accordance with the present invention.

FIG. 6 depicts the transducer assembly 40 upon application of the vacuum and heating device so as to form the curved shape of the PVDF film protuberances. Upon reaching the desired curvature level of the protuberances 16, the heating device is turned off and the film is allowed to cool down naturally to ambient level. During this cool down period, the vacuum in chamber 152 is maintained on the assembly until the temperature within chamber 170 reaches ambient level. This is advantageous because if the vacuum is not maintained during this interval, thermal expansion/contraction would tend to flatten the curved areas 16 of the film 10. When the temperature chamber 170 reaches the ambient level, the vacuum is removed and the curved or domed shape of the protuberances 16 are maintained in a substantially permanent position. That is, no additional stimulus is necessary to maintain their shape. FIG. 14 illustrates a cross-sectional view of the transducer assembly having protuberances 16 formed in the manner described above. The transducer 40 is thus operable as a transmitter or receiver of radiating acoustic energy. That is, application of a voltage across the electrode layers 10a and 10b from a signal source (not shown) causes vibration of the protuberances 16 and results in the transducer assembly 40 transmitting acoustic energy at a resonance frequency associated with the transducer assembly 40. When the transducer is operating as a receiver, acoustic energy incident on the PVDF film 10 causes the protuberances 16 to vibrate. The vibrations are converted into electrical signals and transmitted via the electrode layers 10 and 10b to sensing circuitry (not shown) such as a receiver/amplifier. Conductive leads (not shown) may be attached to the electrode layers as is known in the art in order to communicate the electrical signals to additional electronic circuitry assemblies. Note that the electrical signals may be represented as decaying sinusoids when the driving signal is a pulse signal.

Figure 7:
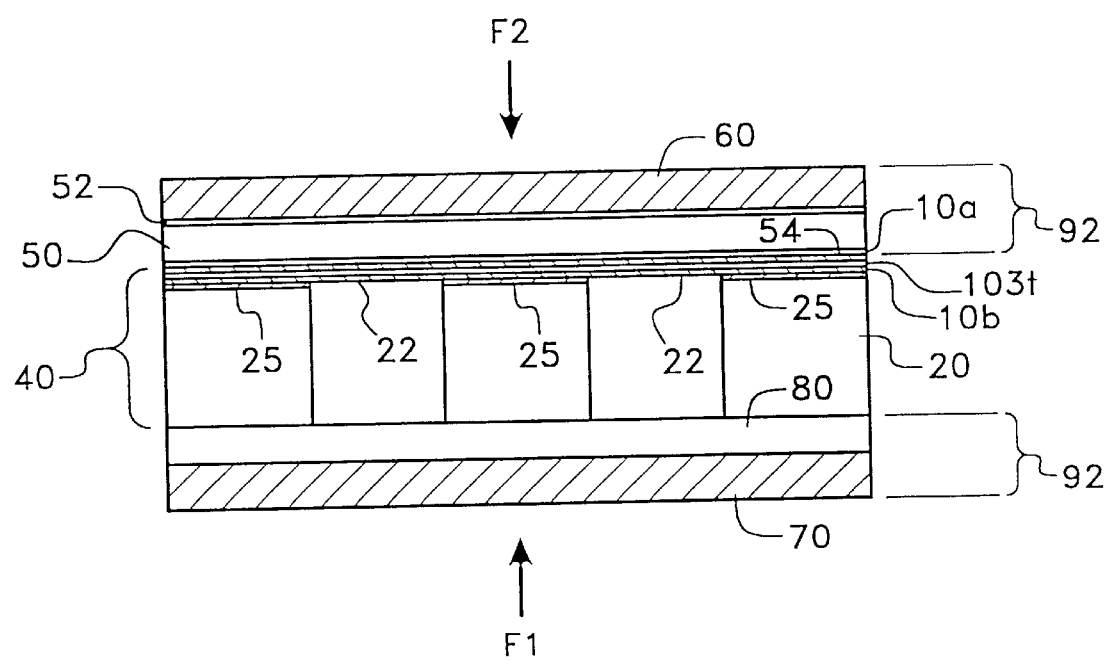
FIG. 7 represents a cross sectional view of the transducer assembly within a press assembly prior to forming protuberances according to an alternative embodiment of the present invention.
Figure 8:
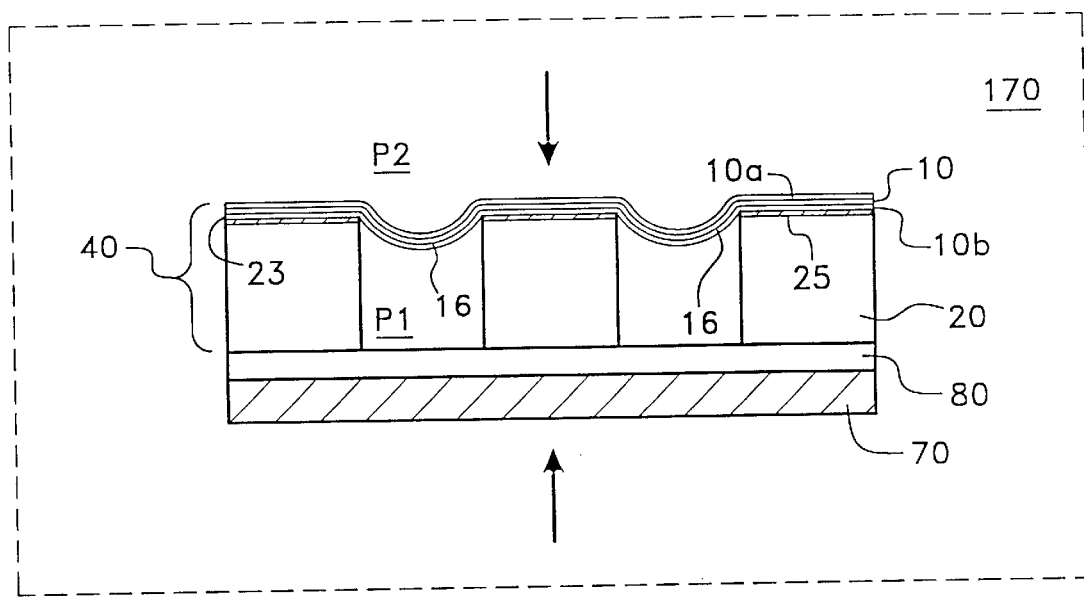
FIG. 8 illustrates the formation of the protuberances within the transducer assembly according to the alternative embodiment of the present invention of FIG. 7.

An alternative method of forming protuberances 16 in piezoelectric film 10 for ultrasound applications is depicted in FIGS. 7 and 8. This transducer fabrication method utilizes a pliable layer of material such as rubber to form an array of domes or protuberances 16 of piezoelectric material under an elevated pressure and temperature. FIG. 7 shows a layer of piezoelectric material 10, such as PVDF film sandwiched between conductive electrodes 10a and 10b on the top and bottom surfaces, respectively, forming a laminate structure. In a preferred embodiment, the PVDF material has a thickness t of about 28 um and is subject to annealing at approximately 85 degrees C. The electrode layers 10a and 10b are preferably formed of either silver ink or a metalized electrode sputtered onto the PVDF layer 10. A substrate 20 having a plurality of apertures or perforations 22 (see FIG. 1) is provided. An adhesive layer 25, such as an epoxy which is preferably conductive, is applied to the top surface of substrate 20 to secure the laminate thereto. This forms a transducer composite assembly structure 40. A layer of pliable material 50, such as a layer of rubber, is disposed onto the top surface of the assembly structure 40 between the top 60 and bottom 70 platens of a press 92. It should be recognized that the above may be accomplished before the epoxy is fully cured. Such a press may be, for example, a hydraulic press providing a compressive force acting on the rubber layer 50 and assembly structure 40. As shown in FIG. 7, the top platen 60 is disposed on top of layer 50. Bottom platen 70 is disposed beneath the bottom surface of substrate 20. A rigid buffer plate 80 is interposed between bottom platen 70 and substrate 20. Plate 80 may be made of glass or metal, for example. Preferably, two layers 52, 54 of non-adhesive material are disposed directly onto the top and bottom surfaces, respectively, of layer 50. The purpose of layers 52 and 54 is to prevent rubber layer 52 from adhering to either the composite assembly 40 or top platen 60, as might occur through heating and/or prolonged use. The release layers 52, 54 may be comprised of polyethylene or other non-adhesive material, for example.

The press is then closed so that the top and bottom platens are compressed toward one another. The compression exerts forces F1 and F2 in the directions indicated in FIG. 7. This causes the top platen 60 to forcibly engage rubber layer 50. Transducer assembly 40 is, in turn, in forced engagement with both rubber layer 50 at its top portion and bottom platen 70 (via glass plate 80) at its bottom portion. Application of sufficient pressure via the press through the rubber material layer 50 results in a pressure difference P2−P1 between the top surface of the film 10 and the bottom surface of the substrate sufficient to form protuberances 16 in the film at the locations of the perforations 22, as shown in FIG. 8. The sandwiched PVDF transducer assembly 40 is subjected to an elevated temperature of between 65 and 85 degrees C. This may be accomplished via temperature controllable heating coils formed within the top platen 60 (and bottom platen 70) to form a heated press, or by placing the press containing the transducer assembly 40 in a temperature chamber 170. Such temperature chambers and heated presses are well known and will not be described in further detail. In a preferred embodiment, the transducer assembly 40 is treated by placing it in a heated press and applying a temperature of 85 degrees C. while pressure differential of 13 psi is applied across the assembly 40 for approximately 2–3 hours. When the protuberances 16 of film 10 reach the desired curvature level, the heating device is turned off and the temperature of the film is allowed to cool down to ambient level. Through the above process, the curved or domed shape of the protuberances 16 are maintained in a substantially permanent position. It should also be understood that the parameters of pressure and temperature may vary depending on a number of factors, such as the requisite degree of curvature and extension of the protuberances 16 through the substrate apertures 22, and the type of material for layer 50, as well as the thickness of the rubber layer 50, for example.

As a final step, in order to stabilize the transducer performance over time, a post annealing process may also be performed. This may be accomplished by exposing the fabricated transducer assembly to either (1) a high temperature process, such as application of 80 degree C. heat for approximately 2 hours, or (2) thermal cycles, such as −40 degrees C. and 80 degrees C. for 20 hours.

Figure 16A:
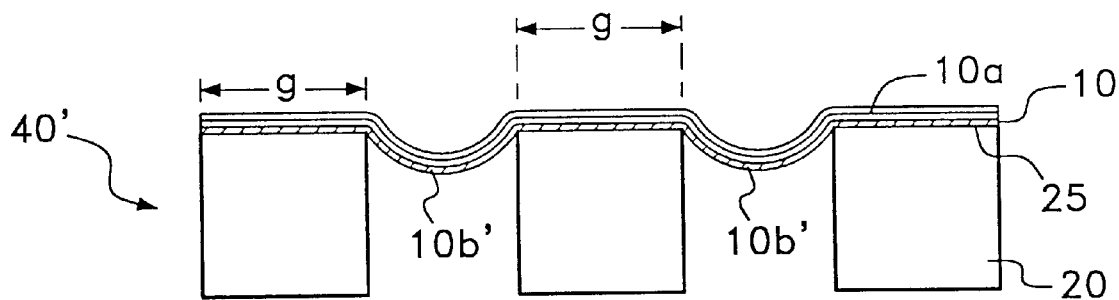
FIG. 16A represents a transducer assembly in which electrodes are patterned onto a piezoelectric material in accordance with an aspect of the present invention.
Figure 16B:
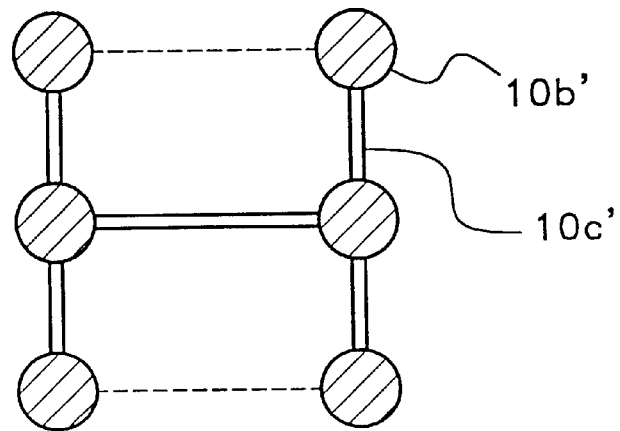
FIG. 16B illustrates the interconnection lines associated with the patterned electrode configuration depicted in FIG. 16A.

It should further be understood that, while the above discussions depicted electrode layers 10a and 10b uniformly disposed on the top and bottom surfaces of the PVDF layer 10 (and hence uniformly applied to the top surface of substrate 20) an alternative embodiment shown in FIG. 16A illustrates a transducer arrangement 40' whereby an electrode layer 10b' is selectively patterned such that the electrode layer when laminated onto the substrate, is disposed over essentially only the apertures 22 of substrate 20, with the electrodes 10b' connected to one another via narrow interconnecting electrode portions 10c' as shown in FIG. 16B. This results in formation of a gap g between adjacent portions of electrode layer 10b'. This electrode patterning serves to reduce the capacitance of the transducer device and thus may result in a current reduction. When the transducer is operating as a transmitter, the patterned electrode layer serves to reduce power consumption by drawing less current. When the transducer is operated as a receiver, the patterned electrode layer 10b' increases the sensitivity of the receiver.

As previously mentioned, the shape of the curved PVDF film 10 depends on the film thickness, the dimension and the shape of the apertures 22 of the substrate 20, the vacuum pressure within cavity 152, and the temperature within chamber 170. FIGS. 2, 3A, 3B, 3C, and 4A, 4B, 4C illustrate fundamental (but not exhaustive) shapes of the apertures of a substrate for ultrasound applications. The dimensions of the apertures, in combination with vacuum pressure and film thickness, have a significant effect on the curvature of the film, and therefore the resonance frequency of the transducer. This is because the curvature C or radius of the protuberances (see FIG. 14) determine the resonance frequency of the transducer. Since certain PVDF films have properties wherein when the film is stretched in one direction its piezoelectric activity is much greater in that direction than the others in the film plane, hence the dimension of the apertures in that direction are more important. However, it is known that other PVDF films exhibit substantially similar properties in two directions. The present invention contemplates the use of these films as well, such that the orientation of the film onto the substrate is not a factor. In any event, the overall active area of the transducer is determined by the total area of the apertures. Thus, for a given size of a transducer, the higher the aperture or hole area percentage, the higher the acoustic energy transmitted.

Figure 17A:
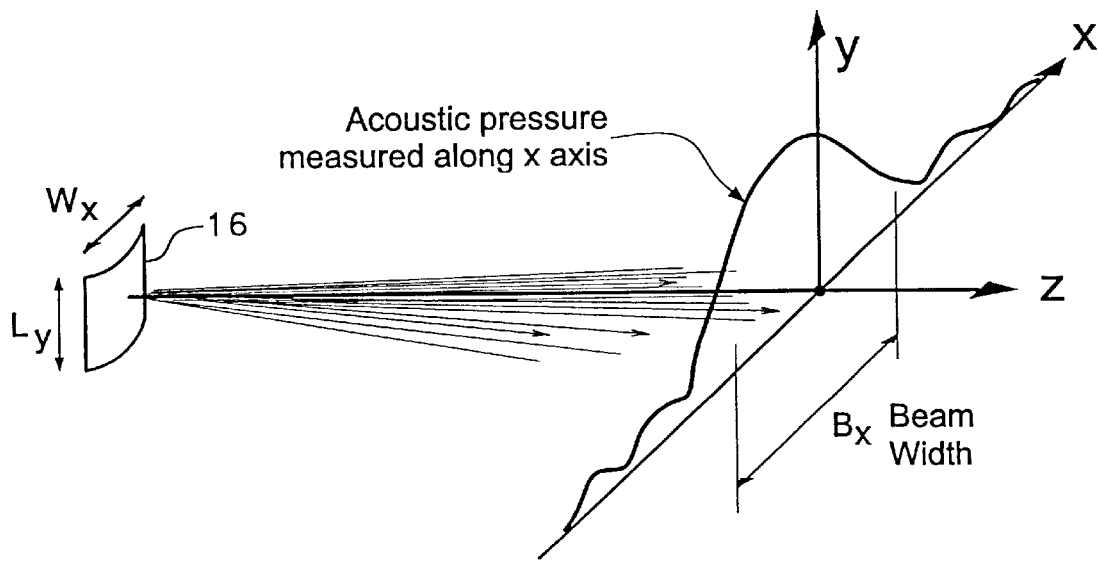
FIGS. 17A and 17B illustrate the formation and measurement of beam widths or beam angles in the horizontal (x-direction) and vertical (y-direction) planes according to the present invention.
Figure 17B:
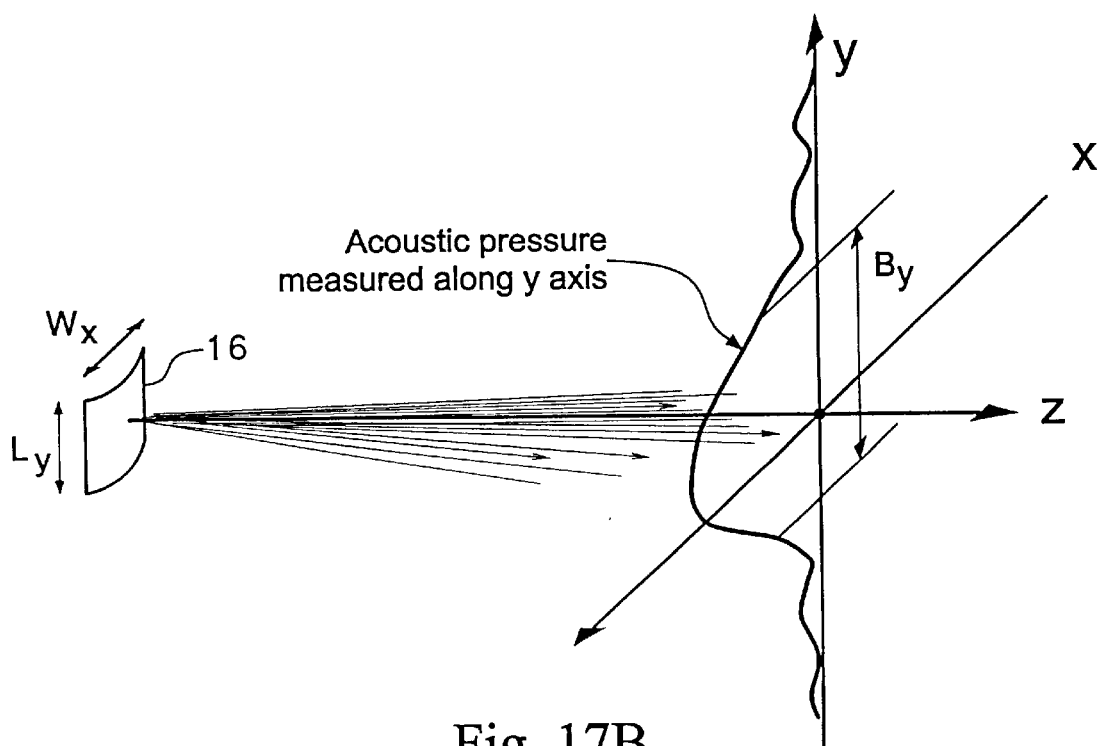

Using the above-described processes of forming curved PVDF, at least three different types of transducers can be made. A broad beam pattern, low cost transducer is embodied in FIGS. 3A–3B. Such a transducer may be formed, for example, when there are only one (FIG. 3A) or two (FIG. 3B) rectangular apertures 22 on the substrate 20 and the active direction of the film 10 is along the width w direction of the apertures or slots. The resonance frequency of the transducer assembly 40 is determined by the curvature radius of the film in the width direction w as shown in FIG. 3B. The beam angles of the ultrasound pattern are determined by the total active area comprising the total of the width w (in the x-direction) and L (in the y-direction) of the array of apertures 22 in which are formed the corresponding protuberances 16, and the central inactive regions I. Thus, referring to FIGS. 3B and 3C, the horizontal beam angle of the ultrasound pattern is determined by the width dimension H (or H1 in FIG. 3C) of the array of apertures 22 and the inactive region, while the vertical beam angle is determined by the length dimension L (or L1 in FIG. 3C) of the array of apertures 22. As one can understand the dimension H1 in FIG. 3C is given by the sum total of the width w of the apertures and the inactive regions I1. In similar fashion, L1 is determined by the sum of the distances L and the inactive regions I2. With these configurations, symmetrical or asymmetrical beam patterns can be designed by adjusting the aperture 22 dimensions and arrangements. FIGS. 17A and 17B illustrate the formation and measurement of beam widths or beam angles associated with the horizontal (x-direction) and vertical (y-direction) orientations of a given protuberance 16. As shown in FIG. 17A, the beam width Bx is determined by the width Wx, while the beam width By is determined by Ly, as shown in FIG. 17B. Note that in order to measure beam angle along the x-axis, an acoustic detector is moved along that axis. The intensity will produce a maximum peak at the width Bx. Similarly, maximum acoustic pressure or intensity is measured along the y-axis by moving an acoustic detector along the y-axis, to the point where the intensity peaks. The beamwidth By is depicted in FIG. 17B.

Figure 9:
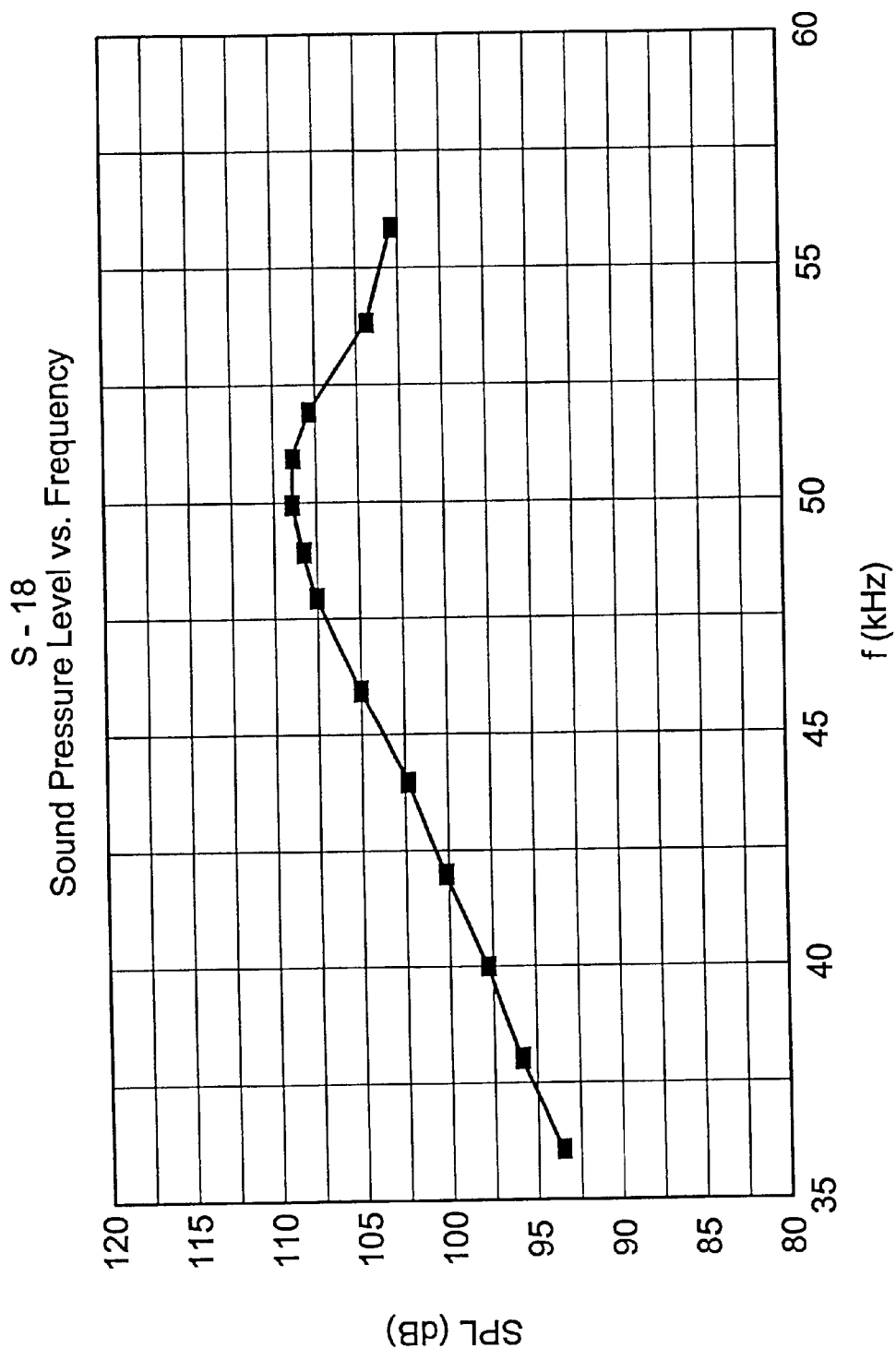
FIGS. 9–13 illustrate measured sound pressure level as functions of frequency and beam angle for various types of transducer assemblies having protuberances formed through the perforations in the substrate in accordance with the present invention.
Figure 10:
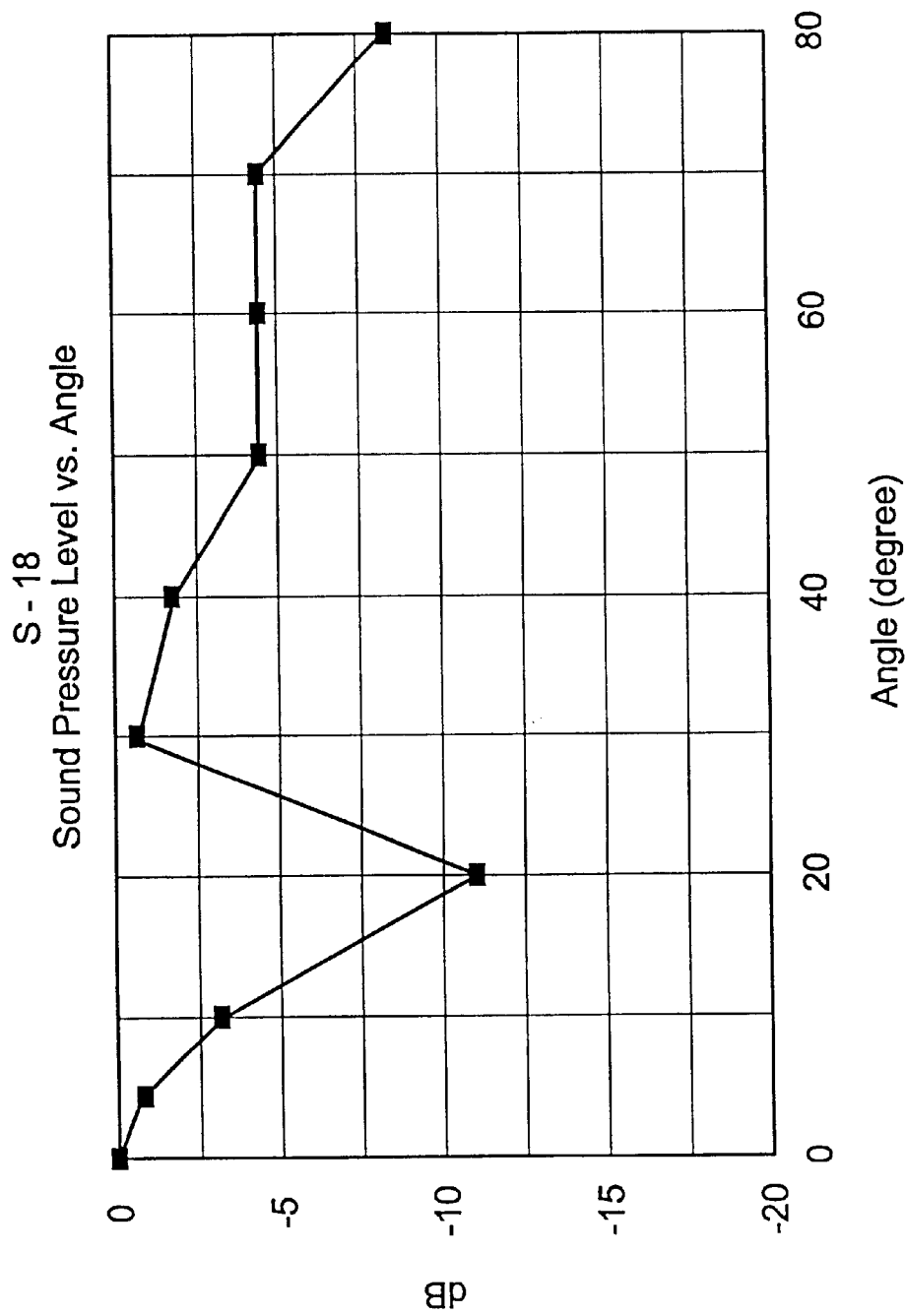
Figure 11:
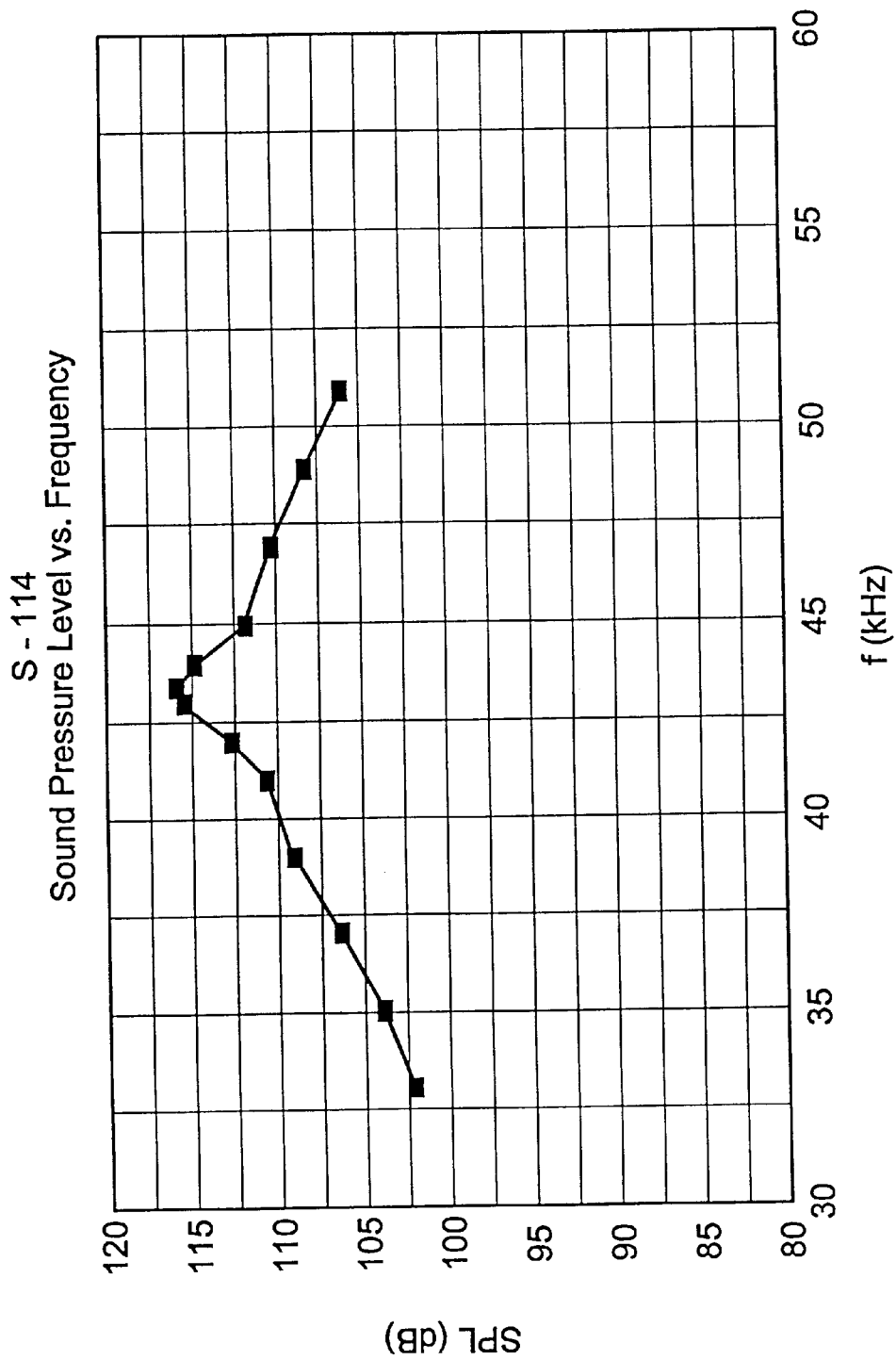

For a flat low frequency (<100 kHz) air transducer the substrate 20 may be formed of a metal like aluminum or a non-metal (non-conductor) such as a printed circuit board in a flat or planar configuration. The apertures for forming the protuberances 16 can be in a rectangular or circular shape. FIGS. 9 and 10 illustrate measured sound pressure level as functions of frequency and beam angle for a given ultrasound transducer of this type. In this example, the transducer has two rectangular slots or apertures and a PVDF film thickness of 30 $\mu$m. The applied voltage was 100 V(peak) and detecting distance was 53 cm. FIG. 11 is the result of another sample transducer (S114) where a thicker film (52 $\mu$m) was used and the applied voltage was 155 V (peak).

Figure 12:
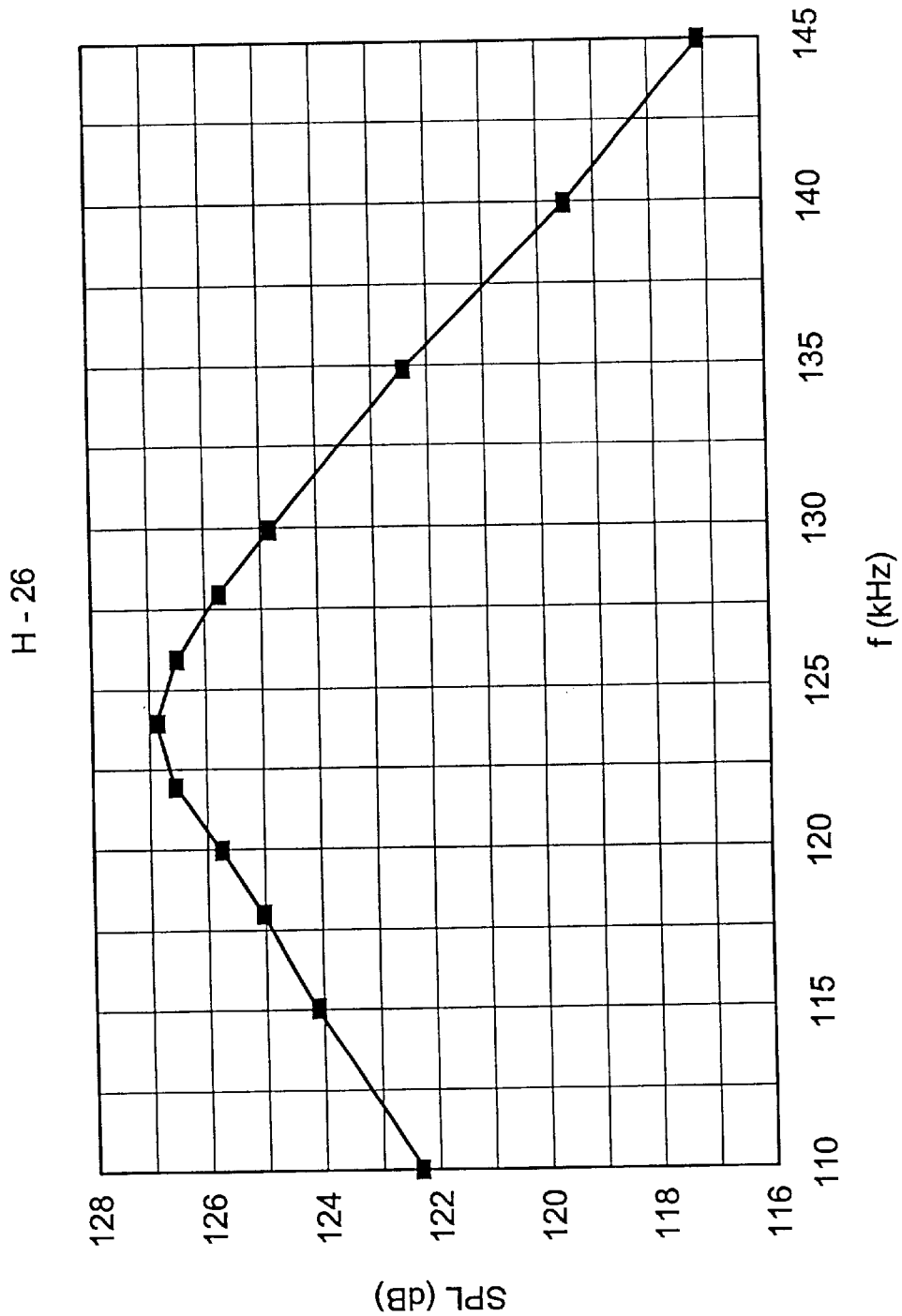

FIG. 3C depicts a high output, narrow beam pattern ultrasound transducer formed when PVDF film is laminated onto a flat perforated substrate 20 having a patterned array of rectangular apertures 22. Such example depicts a flat high frequency (>100 kHz) air transducer. It should be noted however, that the apertures 22 can take on a variety of shapes including that of a circle, a rectangle, and so on. The features of the transducer of FIG. 3C are large radiating area determined by L1*H1, a high output and concentrated ultrasound beam. For this kind of transducer, the resonance frequency is high because the radius of curvature C of the protuberances 16 is relatively small. Therefore, the dimensions of the apertures 22 of the substrate 20 are much smaller than that for low frequency transducers. Preferably, a perforated metal is used as the substrate 20. For a transducer of this type having circular apertures 22, an exemplary embodiment of the diameter of the circles may range from 0.030" to 0.065". For a transducer as shown in FIG. 3C having rectangular apertures 22, the width of the rectangles ranged from 0.8 mm to 1.5 mm and the length of the rectangles ranged from 1 cm to 3 cm. FIG. 12 shows the measured sound pressure level for a sample transducer having apertures 22 of 0.038" diameter and 45% aperture area. The PVDF film 10 used was about 30 $\mu$m in thickness with metalized electrodes disposed thereon. The applied voltage was 145 V(peak) and the detecting distance was 53 cm. As shown in FIG. 12, the peak frequency is around 124 kHz.

Figure 4A:
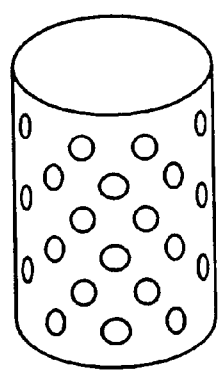
FIG. 4A represents a schematic view of an omnidirectional ultrasound transducer having a substrate with circular perforations according to an aspect of the present invention.
Figure 4B:
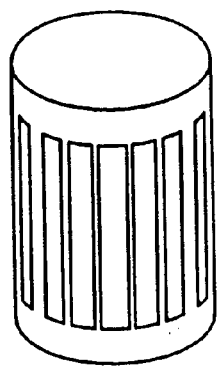
FIG. 4B represents a schematic view of an omnidirectional ultrasound transducer having a substrate with rectangular perforations in the longitudinal dimension, according to an aspect of the present invention.
Figure 4C:
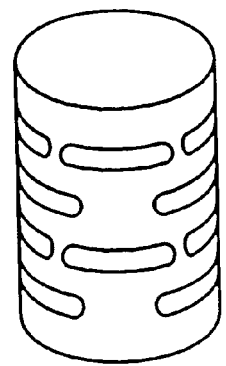
FIG. 4C represents a schematic view of an omnidirectional ultrasound transducer having a substrate with rectangular perforations in the latitudinal dimension, according to an aspect of the present invention.
Figure 4D:
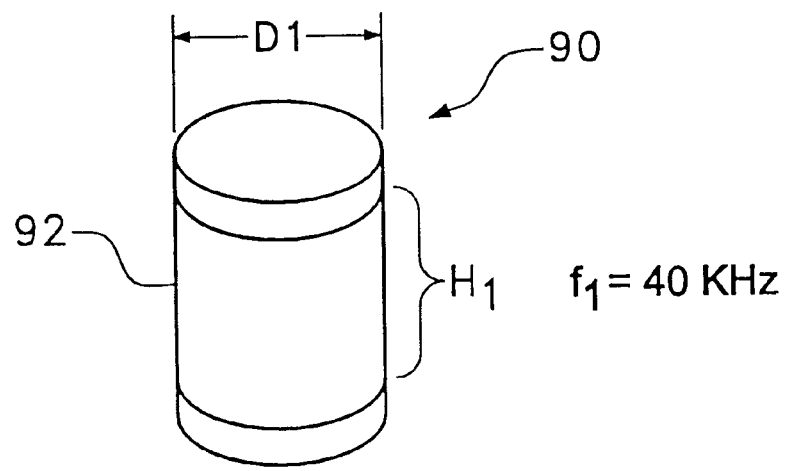
FIGS. 4D and 4E represent prior art cylindrical transducer structures having different cylinder diameters and different operational frequencies.
Figure 4E:
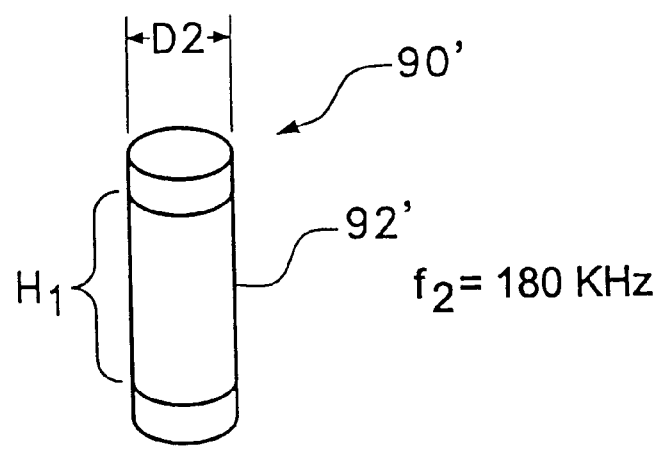
Figure 13:
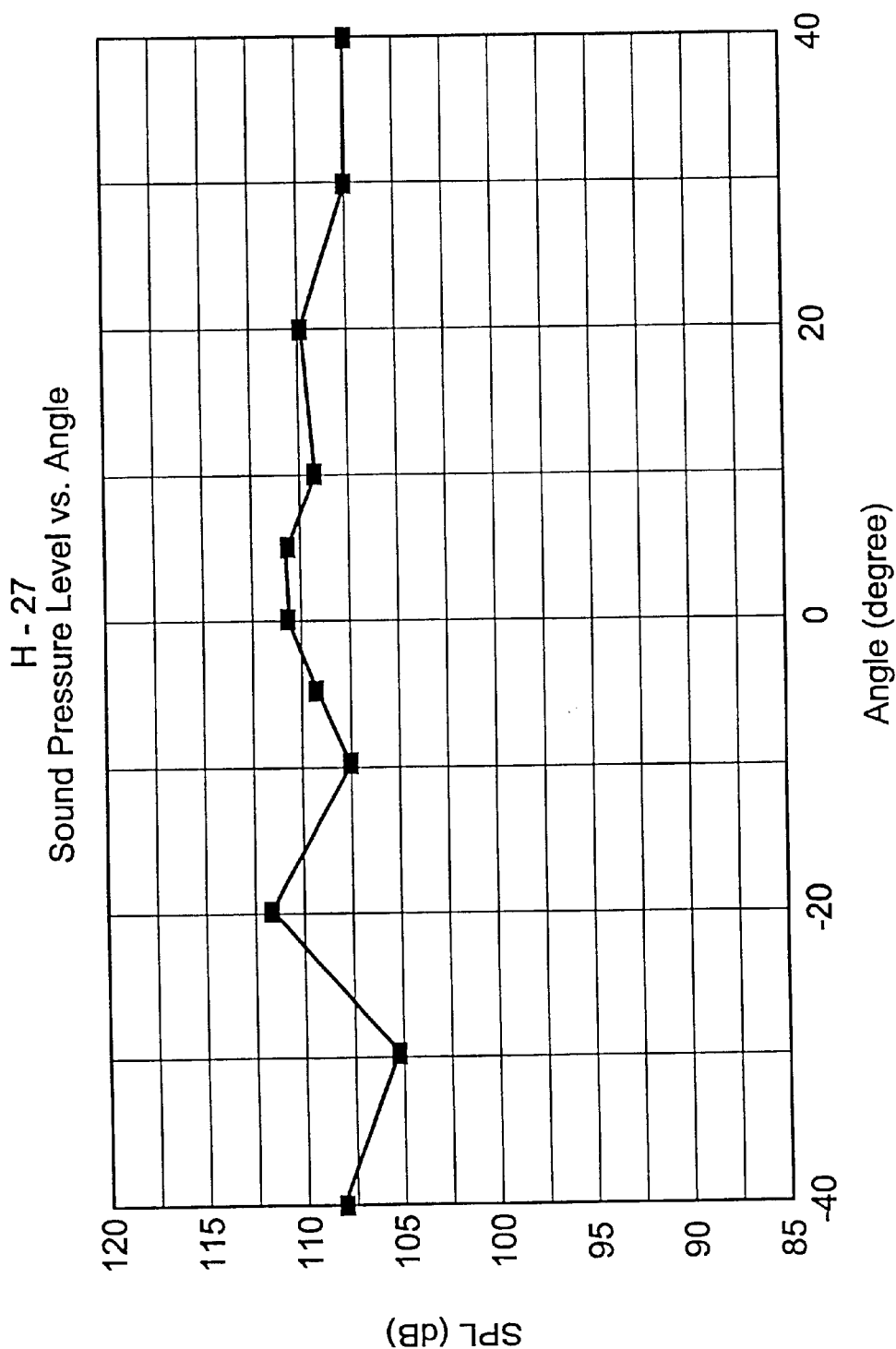

Referring now to FIGS. 4A, 4B, and 4C, an omnidirectional ultrasound transducer can be formed by laminating PVDF film onto a perforated cylinder substrate with the stretched direction in the circumferential direction to provide a transducer with 360 degree beam pattern. An advantage of such a transducer assembly according to the present invention is that the diameter of the cylindrical substrate can be designed at any value and is not limited by the resonance frequency. As is understood, present transducer cylindrical designs (and in the more general case, curved piezoelectric film transducers) such as that depicted in FIGS. 4D and 4E are limited in their frequency by the diameter or radius of the cylinder. For example, a typical resonance frequency of about 40 KHz associated with the cylindrical shaped transducer 90 comprising a PVDF layer of material 92 requires a given cylinder diameter D1. However, for a high frequency transducer 90' operating at, say 180 KHz, the cylinder diameter D2 would be exceedingly smaller than that of D1. Such small size may cause significant limitations on the use and application of such high frequency transducers, as well as causing manufacturing problems. However, the present invention overcomes these problems by the formation of a shaped substrate having perforations or apertures formed therein and on which is laminated a layer of piezoelectric material such as shown in FIGS. 4A–4C. The shape of the apertures of the substrate can be circles or rectangular slots as shown in FIGS. 4A–4C. As mentioned above, the frequency of a curved transducer such as an omnidirectional PVDF ultrasound transducer is shown in FIGS. 4D and 4E is limited by the diameter of the film cylinder. However, for the curved PVDF disposed onto the perforated substrate, the resonant frequency of the transducer is determined by the curvature C of the protuberances formed in the apertures of the substrate, and not the cylinder diameter D. Therefore, the apparatus according to the present invention enables one to achieve a higher frequency transducer device, while the diameter of the transducer can be designed to be any dimension. Test results of one of such sample is shown in FIG. 13. The sample was made from laminating a 28μm PVDF film on a perforated cylinder substrate.

Note that the relationship between the curvature radius R and the resonance frequency fo of the transducer are as follows: for a spherically curved film the resonant frequency is given as $$fos=(1/2\pi R)[2Y/\rho(1-\sigma)]^{1/2} \quad (1)$$

For a cylindrically curved film the resonant frequency is given as $$foc=(1/2\pi R)[Y/\rho(1-\sigma^2)]^{1/2} \quad (2)$$

Where the parameters:

Y (Young's modulus of film averaged over the electrode material)

$$Y = \frac{2Y_{AG}t_{AG} + Y_p t_p}{2t_{AG} + t_p} \quad (3)$$

$$Y_{AG} = 7.8 \times 10^9 \, N/m^2 \text{(Ag ink)}$$

$$Y_p = 5 \times 10^9 \, N/m^2 \text{(PVDF)}$$

σ: density of film averaged over electrode $$\rho = \frac{2\rho_{AG}t_{AG} + \rho_p t_p}{2t_{AG} + t_p} \quad (4)$$

$$\rho_{AG} = 4000 \, kg/m^3$$

$$\rho_p = 1880 \, kg/m^3$$

ρ: Poisson's ratio; 0.3 for silver ink and PVDF
t: thickness
A numerical example is provided below where:

$$\text{used } Y = \frac{2 \times 7.8 \times 10^9 \times 6.5 \times 10^{-6} + 5 \times 10^9 \times 30 \times 10^{-6}}{2 \times 6.5 \times 10^{-6} + 30 \times 10^{-6}} = 5.85 \times 10^9 \, N/m^2$$

$$\rho = \frac{2 \times 4000 \times 6.5 \times 10^{-6} + 1880 \times 30 \times 10^{-6}}{2 \times 6.5 \times 15^{-6} + 30 \times 10^{-6}} = 2520 \, kg/m^3$$

$t_{AG}=6.5 \, \mu m \, t_p=30\mu \, \sigma=0.30$
R=0.310" (<7.87 mm)
(2) $f_{oc}$=40 kHz (Experimentally 42 kHz observed) used the same Y, ρ, $t_{AG}$, $t_{94}$, ρ but R=1.4" (=6.35 mm)

Thus, applying a voltage to the surface electrodes generates a displacement in the length direction (or molecular orientation) of the device. The PVDF film is curved and the periphery is clamped so that the lengthwise displacement is converted to vibration normal to the surface for generating an acoustic wave having a resonance frequency $f_{oc}$ given by equation 2 above.

Figure 15:
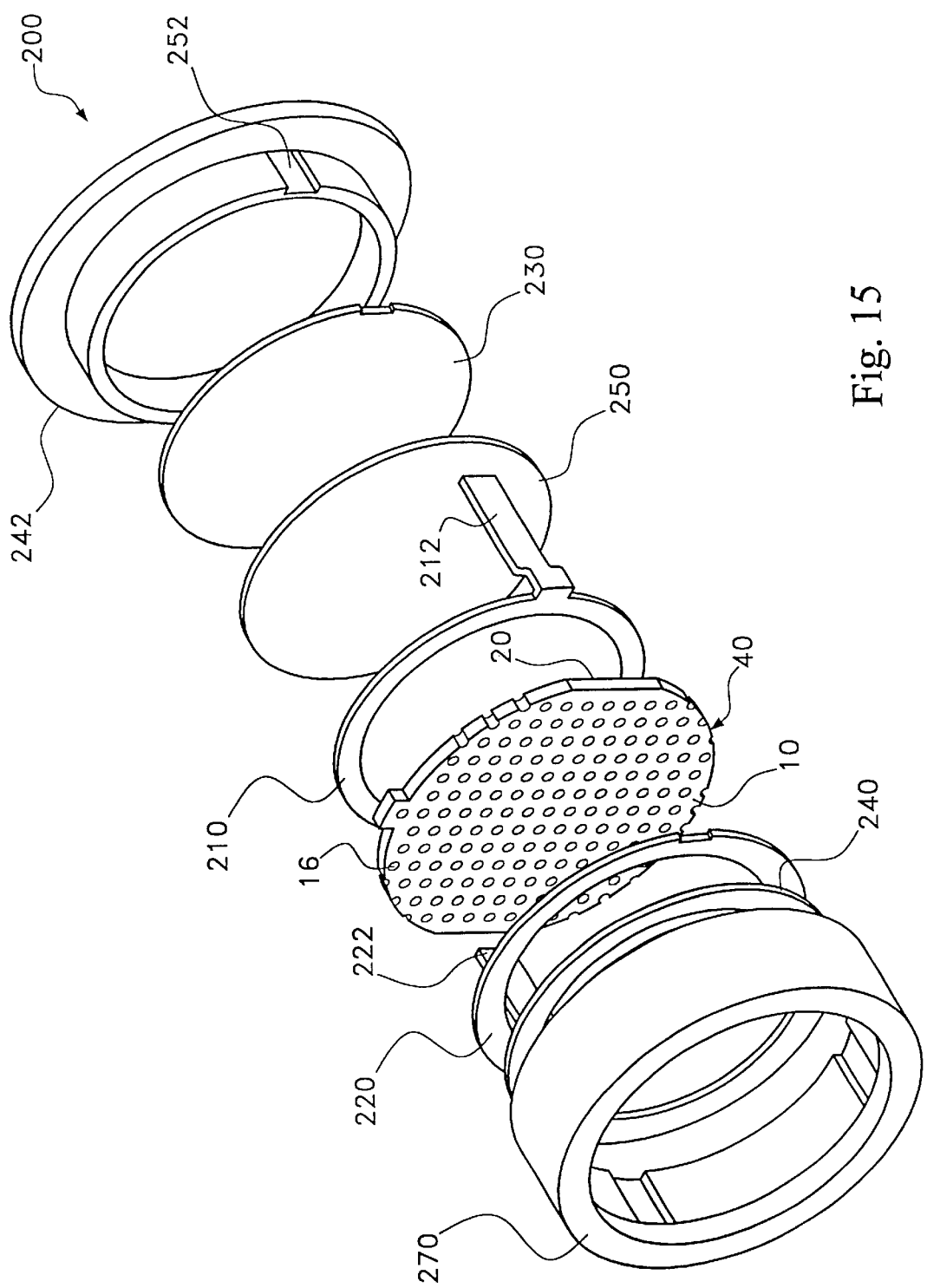
FIG. 15 represents an exploded view of a packaging design incorporating the transducer assembly formed in accordance with the present invention.

FIG. 15 depicts the PVDF sensor unit 40 mounted within an assembly 200 and operative as an ultrasound transducer such as a speaker device for emitting (or receiving) acoustic signals. The PVDF sensor element 10 is protected by the perforated substrate 20 which in the preferred embodiment comprises a conductive material such as brass, copper or aluminum. Two spring contacts 210 and 220 provide conductive connections on either side of the ultrasonic transducer assembly sensor element 40. Contacts 210 and 220 are formed as annular rings having contact leads 212 and 222 respectively, which are disposed in an axial direction for insertion into corresponding slots 242 and 252 of end cap 240. Electrical connection is maintained through compressive forces achieved during the assembly bonding process. In addition, gaskets 240 and 250 on either side of the contacts help maintain a uniform pressure. Contact 240 is preferably formed of silicone rubber and is preferably an annular ring of silicone rubber which engages the outer periphery of bezel portion 270. Gasket 250 is a solid gasket comprising a silicone rubber material which is sandwichedly coupled between annular contact 210 and solid contact 230. Contact 230 provides shielding protection for the ultrasound transducer device. The contacts operate to exit the back of the sensor element for easy attachment of wires. Alternatively, the attachment may be made directly to a printed circuit board if required.

The entire sensor package 200 may be bonded together using adhesives (under pressure) or preferably ultrasonically welded provided the bezel and end cap are manufactured using suitable materials such as a polycarbonate or ABS. The bonded assembly helps to maintain a constant electrical connection between the contacts and sensor element 40.

While the foregoing invention has been described with reference to the above embodiments, various modifications and changes can be made without departing from the spirit of the invention. Accordingly, all such modifications and changes are considered to be within the scope of the appended claims.

What is claimed is:

1. A method of forming protuberances in piezoelectric material for an acoustic device comprising:

providing a substrate having a plurality of perforations of a given dimension formed therein;

forming a laminate comprising a film of polymer piezoelectric material sandwiched between a first electrode layer on a top surface and a second electrode layer on a bottom surface;

securing the laminate to the substrate to form a composite assembly; and treating the composite assembly to form protuberances in the film at the locations of the perforations.

2. The method according to claim 1, wherein the step of treating the composite assembly further comprises heating the film to a given temperature and applying a pressure differential between the top and bottom surfaces of the composite assembly to form the protuberances.

3. The method of claim 2, wherein the step of heating further comprises heating to a temperature of approximately 85 degrees C. for between 1 to 3 hours.

4. The method according to claim 2, wherein the step of applying a pressure differential comprises forming a vacuum at a bottom surface of the composite assembly and exposing the top surface to atmospheric air to form the pressure differential.

5. The method according to claim 4, wherein the pressure differential is approximately 13 psi.

6. The method according to claim 1, wherein the step of treating the composite assembly further comprises:

securing the bottom surface of the composite assembly to a vacuum chamber;

placing the composite assembly into a temperature chamber; and activating a vacuum pump to cause a pressure differential between the top and bottom surfaces of the composite assembly (while applying heat to the assembly through the temperature chamber for a predetermined time interval) sufficient to form the protuberances in the film; and after the predetermined time interval cooling the composite assembly to a given temperature while maintaining the pressure differential until the given temperature is reached to cause each of the protuberances to maintain a substantially permanent curvature.

7. The method according to claim 1, wherein the substrate comprises a metal.

8. The method according to claim 1, wherein the substrate comprises a printed circuit board.

9. The method according to claim 1, wherein the substrate comprises a plastic.

10. The method according to claim 1, wherein the perforations in the substrate are patterned in a periodic manner.

11. The method according to claim 10, wherein the perforations have a shape selected from the group consisting of a circle, rectangle and rhombus.

12. The method according to claim 1, wherein the first and second electrode layers are formed of silver ink.

13. The method according to claim 1, wherein the first and second electrode layers are formed of metal.

14. The method according to claim 1, wherein the step of securing the laminate to the substrate comprises applying a layer of adhesive material to the substrate.

15. The method according to claim 14, wherein the adhesive material is an epoxy.

16. The method according to claim 1, wherein the step of treating further comprises disposing a top plate layer at the top surface of the film and a bottom plate layer at a bottom surface of the substrate;

disposing a layer of pliable material between the top plate layer and top surface of the film; and compressing the top and bottom plate layers toward one another to cause the layer of pliable material to forcibly engage the film to cause deformation of portions of the film through the perforations in the substrate thereby forming the protuberances.

17. The method according to claim 1, wherein the ultrasound transducer is an omnidirectional transducer.

18. The method according to claim 1, wherein the transducer is a substantially flat transducer.

19. A method of forming a transducer having protuberances comprising:

providing a substrate including a plurality of perforations each of a given dimension formed therein and indicative of a resonance frequency associated with the transducer;

laminating a film of polymeric material onto the substrate, the polymeric material capable of exhibiting piezoelectric properties;

disposing a top plate layer at a top surface of the film and a bottom plate layer at a bottom surface of the substrate;

disposing a layer of pliable material between the top plate layer and the top surface of the film;

compressing the top and bottom plate layers toward each other to cause the layer of pliable material to forcibly engage the film to cause deformation of portions of the film through the perforations in the substrate thereby, forming the protuberances.

20. The method according to claim 19, wherein the film is PVDF.

21. The method according to claim 19, wherein the pliable material is rubber.

22. The method according to claim 19, further comprising the steps of:

heating the film simultaneously with the compression step for a predetermined period; and after the predetermined period, cooling the film to an ambient temperature to cause the protuberances to maintain a substantially permanent curvature.

23. A method of forming an ultrasound transducer having thermoformed protuberances comprising:

providing a substrate having a plurality of perforations each of a given dimension formed therein;

laminating a film of polymeric material onto the substrate, the polymeric material capable of exhibiting piezoelectric properties when strained in its plane and electrically biased by a field applied in a direction normal to its faces;

heating the film to a given temperature and applying a pressure differential between top and bottom surfaces of the film to form protuberances in the film through the perforations in the substrate for a predetermined time interval; and cooling the heated film to a given temperature while maintaining the pressure differential until the given temperature is reached to cause the protuberances to maintain a substantially permanent curvature.

* * * * *